United States Patent
Wada et al.

(10) Patent No.: US 11,557,632 B2
(45) Date of Patent: Jan. 17, 2023

(54) RADIATION DETECTOR, RADIATION IRRADIATION DEVICE, AND RADIATION METHOD

(71) Applicant: KABUSHIKI KAISHA TOSHIBA, Tokyo (JP)

(72) Inventors: Atsushi Wada, Kawasaki (JP); Isao Takasu, Setagaya (JP); Kohei Nakayama, Kawasaki (JP); Fumihiko Aiga, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 56 days.

(21) Appl. No.: 17/179,474

(22) Filed: Feb. 19, 2021

(65) Prior Publication Data

US 2022/0085108 A1    Mar. 17, 2022

(30) Foreign Application Priority Data

Sep. 11, 2020  (JP) .............................. JP2020-153195

(51) Int. Cl.
*H01L 27/28*     (2006.01)
*H01L 27/30*     (2006.01)
(Continued)

(52) U.S. Cl.
CPC .......... *H01L 27/288* (2013.01); *G01T 1/2018* (2013.01); *H01L 27/281* (2013.01); *H01L 27/308* (2013.01); *H01L 27/3234* (2013.01)

(58) Field of Classification Search
CPC . G01T 1/2018; H01L 27/3234; H01L 27/288; H01L 27/281; H01L 27/308
See application file for complete search history.

(56) References Cited

U.S. PATENT DOCUMENTS

| 2008/0074356 A1* | 3/2008 | Cok | ...................... G09G 3/3233 345/76 |
| 2012/0241628 A1* | 9/2012 | Hesser | .................. G01T 1/2018 250/361 R |

(Continued)

FOREIGN PATENT DOCUMENTS

JP    2014-529728 A    11/2014

OTHER PUBLICATIONS

Saint-Gobain Ceramics & Plastics, Inc. Scintillation Products, 16 pages (Year: 2007).*

*Primary Examiner* — David P Porta
*Assistant Examiner* — Fani Polyzos Boosalis
(74) *Attorney, Agent, or Firm* — Oblon, McClelland, Maier & Neustadt, L.L.P.

(57) ABSTRACT

According to one embodiment, a radiation detector includes a first layer, a first light-emitting part, a detecting part, a detection circuit, and a first drive circuit. The first layer includes a first organic material. The first light-emitting part includes a first organic light-emitting layer. The detecting part is provided between the first layer and the first light-emitting part. The detecting part includes an organic photoelectric conversion layer and is configured to generate an electrical signal corresponding to radiation incident on the first layer. The detection circuit is configured to output a detection signal based on the electrical signal. The first drive circuit is configured to supply a first drive signal to the first light-emitting part based on the detection signal.

14 Claims, 9 Drawing Sheets

(51) Int. Cl.
    *G01T 1/20*    (2006.01)
    *H01L 27/32*   (2006.01)

(56) References Cited

U.S. PATENT DOCUMENTS

2017/0168165 A1* 6/2017 Kusner ................ G01T 1/2018
2021/0055435 A1  2/2021 Aiga et al.

* cited by examiner

RADIATION DETECTOR, RADIATION IRRADIATION DEVICE, AND RADIATION METHOD

CROSS-REFERENCE TO RELATED APPLICATIONS

This application is based upon and claims the benefit of priority from Japanese Patent Application No. 2020-153195, filed on Sep. 11, 2020; the entire contents of which are incorporated herein by reference.

FIELD

Embodiments of the invention generally relate to a radiation detector, a radiation irradiation device, and a radiation detection method.

BACKGROUND

For example, a medical radiation irradiation device or the like irradiates radiation on a human body or the like. Such an application includes a radiation detector that detects the irradiation amount of the radiation. It is desirable for the radiation detector to be easier to use.

DETAILED DESCRIPTION

Figure 1:
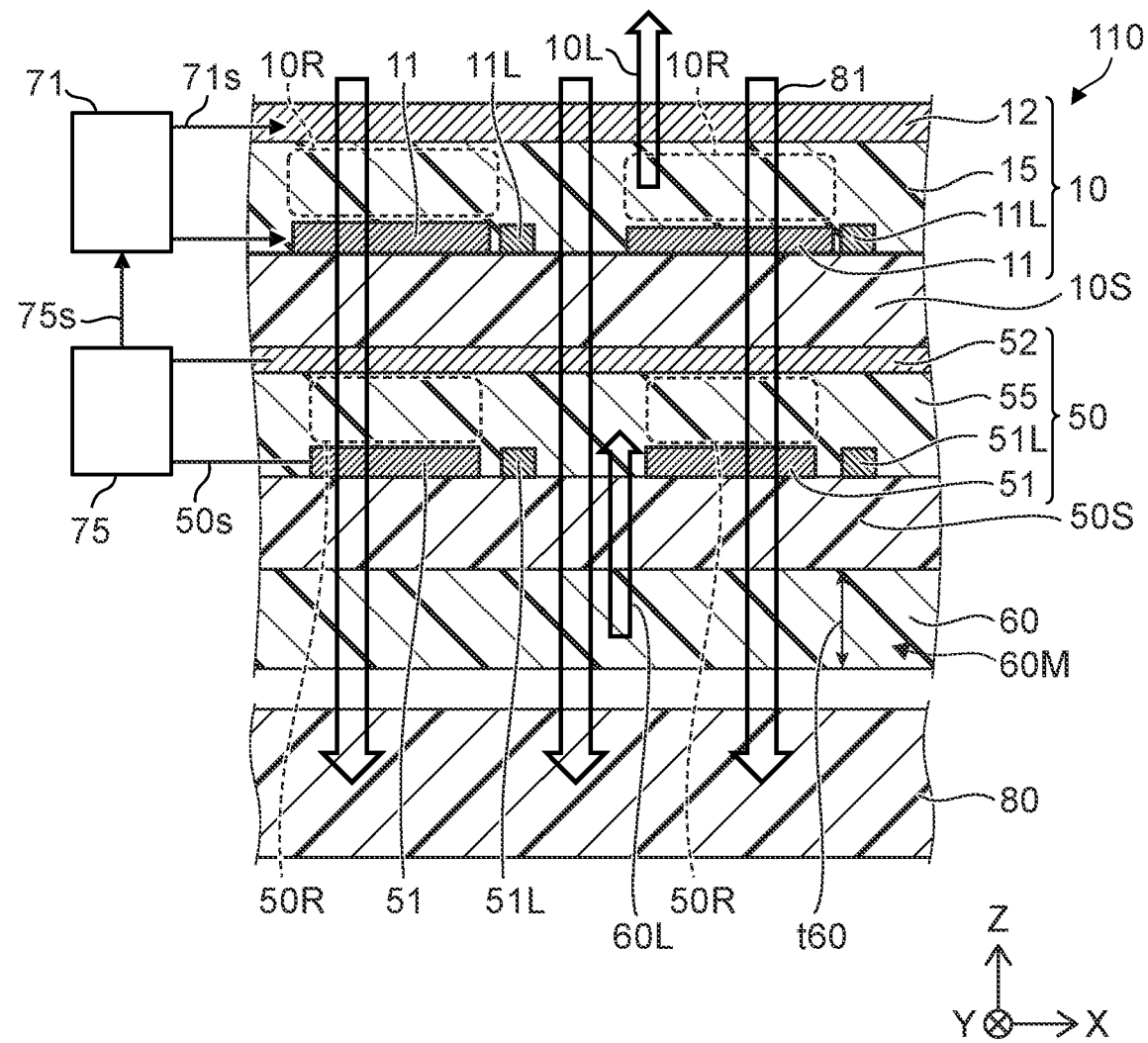
FIG. 1 is a schematic cross-sectional view illustrating a radiation detector according to the first embodiment.

According to one embodiment, a radiation detector includes a first layer, a first light-emitting part, a detecting part, a detection circuit, and a first drive circuit. The first layer includes a first organic material. The first light-emitting part includes a first organic light-emitting layer. The detecting part is provided between the first layer and the first light-emitting part. The detecting part includes an organic photoelectric conversion layer and is configured to generate an electrical signal corresponding to radiation incident on the first layer. The detection circuit is configured to output a detection signal based on the electrical signal. The first drive circuit is configured to supply a first drive signal to the first light-emitting part based on the detection signal.

According to one embodiment, a radiation irradiation device includes the radiation detector described above, and a radiation emitter causing the radiation to be incident on the detector.

According to one embodiment, a radiation detection method can include acquiring an electrical signal from a detecting part provided between a first layer and a first light-emitting part. The first layer includes a first organic material. The first light-emitting part includes a first organic light-emitting layer. The detecting part includes an organic photoelectric conversion layer. The electrical signal corresponds to radiation incident on the first layer. The method can include supplying a first drive signal to the first light-emitting part based on a signal based on the electrical signal.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a radiation detector according to the first embodiment.

Figure 2:
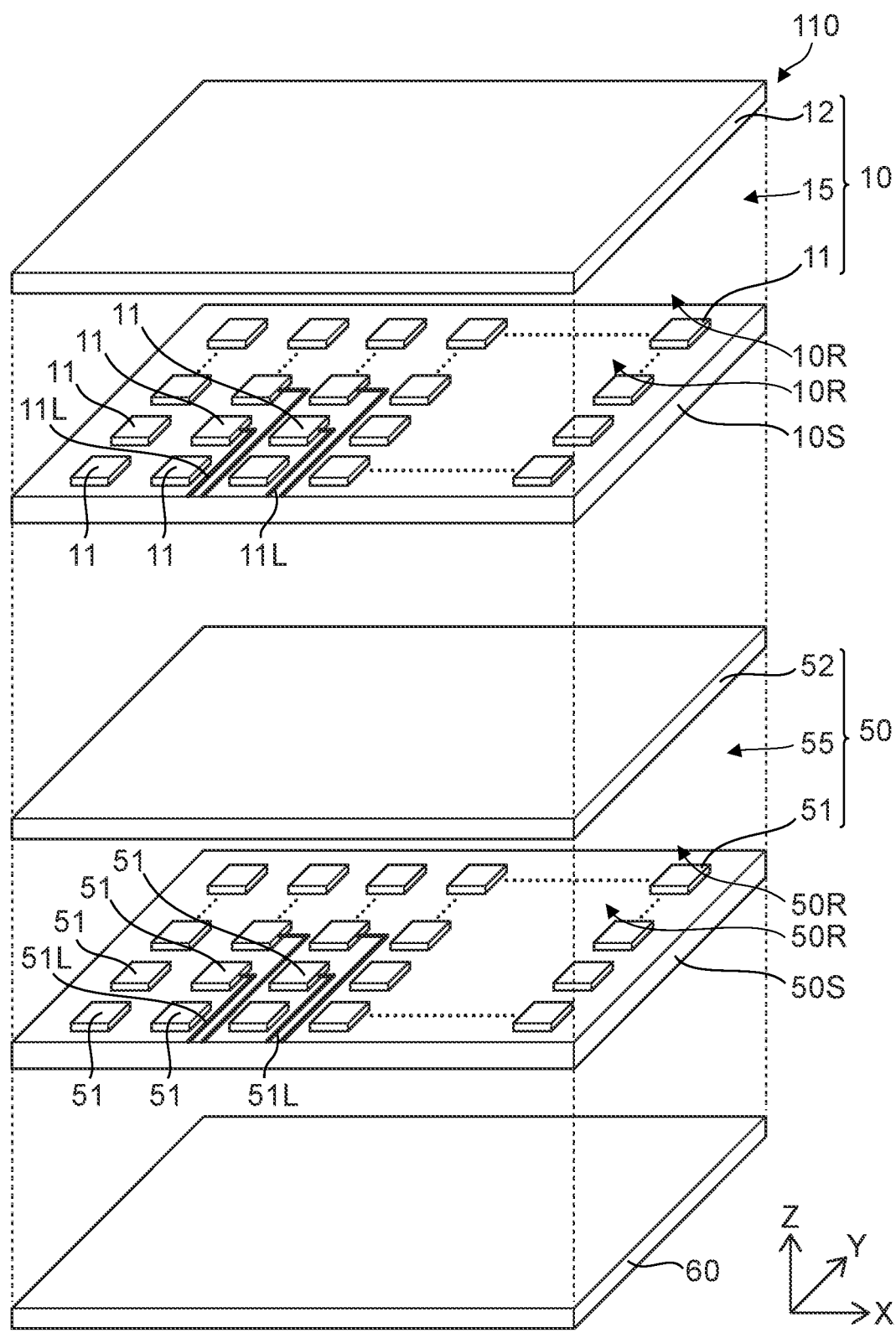
FIG. 2 is a schematic perspective view illustrating the radiation detector according to the first embodiment

FIG. 2 is a schematic perspective view illustrating the radiation detector according to the first embodiment.

In FIG. 2, multiple components that are included in the radiation detector are drawn as being separated from each other for easier viewing of the drawing.

As shown in FIG. 1, the radiation detector 110 according to the embodiment includes a first layer 60, a first light-emitting part 10, a detecting part 50, a detection circuit 75, and a first drive circuit 71. Interposing substrate 10S and 50S can be provided.

The first layer 60 includes a first organic material 60M. In one example, the first organic material 60M includes a metal complex. Examples of the first organic material 60M are described below.

The first layer 60 is configured to emit light 60L that corresponds to the intensity of radiation 81 incident on the first layer 60. For example, the first layer 60 functions as a scintillator.

The first light-emitting part 10 includes a first organic light-emitting layer 15.

The detecting part 50 is located between the first layer 60 and the first light-emitting part 10. The detecting part 50 includes an organic photoelectric conversion layer 55. The detecting part 50 is configured to generate an electrical signal 50s that corresponds to the radiation 81 incident on the first layer 60. For example, the light 60L that is emitted from the first layer 60 is incident on the detecting part 50. The detecting part 50 converts the light 60L into the electrical signal 50s.

The electrical signal 50s is supplied to the detection circuit 75. The detection circuit 75 is configured to output a detection signal 75s based on the electrical signal 50s. The detection circuit 75 includes, for example, an amplifier, etc.

The first drive circuit 71 is configured to supply a first drive signal 71s to the first light-emitting part 10 based on the detection signal 75s. The first light-emitting part 10 emits light 10L that corresponds to the first drive signal 71s by being driven by the first drive signal 71s. The light 10L includes, for example, visible light.

According to the embodiment, the radiation 81 includes, for example, X-rays. As shown in FIG. 1, for example, the radiation 81 is incident on the first light-emitting part 10. The radiation 81 passes through the detecting part 50 and is incident on the first layer 60. A portion of the radiation 81 that is incident on the first layer 60 passes through the first layer 60 and is incident on an irradiated body 80. The irradiated body 80 is, for example, a human body, etc. Medical treatment of the irradiated body 80 (the human body, etc.) is performed by causing the radiation 81 to be incident on the irradiated body 80.

Thus, the first layer 60 transmits the radiation 81 that passes through the first light-emitting part 10 and is incident on the first layer 60.

Another portion of the radiation 81 that is incident on the first layer 60 is converted into the light 60L by the first layer 60. The light 60L is detected by the detecting part 50; and the intensity of the radiation 81 can be known from the electrical signal 50s obtained from the detecting part 50. By ascertaining the detection result of the intensity of the radiation 81, the irradiation amount of the radiation can be appropriately managed.

The first light-emitting part 10 is provided in the embodiment. The first light-emitting part 10 is driven by the first drive signal 71s based on the detection signal 75s corresponding to the radiation 81. For example, when the intensity of the radiation 81 is high, the intensity of the light 10L emitted from the first light-emitting part 10 is high. Thereby, the intensity of the irradiated radiation 81 can be recognized with the naked eye due to the light 10L.

According to the embodiment, the first light-emitting part 10 overlaps the portion on which the radiation 81 is irradiated. Therefore, the state (the intensity, the distribution, etc.) of the irradiation of the radiation 81 can be intuitively ascertained with the naked eye.

According to the embodiment, a radiation detector that is easier to use can be provided.

A thickness t60 of the first layer 60 (referring to FIG. 1) is not less than 500 μm and not more than 5000 μm. The radiation 81 can appropriately pass through the first layer 60 having such a thickness. Due to such a thickness, the light 60L can be appropriately generated by the radiation 81. For example, high sensitivity is obtained.

As shown in FIGS. 1 and 2, a first direction from the first layer 60 toward the first light-emitting part 10 is taken as a Z-axis direction. The first direction corresponds to the stacking direction. One direction perpendicular to the Z-axis direction is taken as an X-axis direction. A direction perpendicular to the Z-axis direction and the X-axis direction is taken as a Y-axis direction. For example, the first layer 60, the detecting part 50, and the first light-emitting part 10 are along the X-Y plane.

As shown in FIGS. 1 and 2, the first light-emitting part 10 may include multiple first light-emitting regions 10R. The multiple first light-emitting regions 10R are arranged along a first plane (the X-Y plane) crossing the first direction from the first layer 60 toward the first light-emitting part 10.

As shown in FIGS. 1 and 2, the first light-emitting part 10 includes multiple first light-emitting part electrodes 11. One of the multiple first light-emitting regions 10R overlaps one of the multiple first light-emitting part electrodes 11 in the first direction (the Z-axis direction). The portions that correspond to the multiple first light-emitting part electrodes 11 are respectively used to form the multiple first light-emitting regions 10R. In the example, the first light-emitting part 10 further includes a first counter light-emitting part electrode 12. The first organic light-emitting layer 15 is between the first counter light-emitting part electrode 12 and the multiple first light-emitting part electrodes 11.

As shown in FIG. 2, the multiple first light-emitting part electrodes 11 are arranged along the X-Y plane. Accordingly, the multiple first light-emitting regions 10R also are arranged along the X-Y plane. For example, the multiple first light-emitting regions 10R are arranged along a second direction (e.g., the X-axis direction) that is along the first plane (the X-Y plane), and are arranged along a third direction (e.g., the Y-axis direction) that is along the first plane and crosses the second direction.

As shown in FIGS. 1 and 2, for example, the detecting part includes multiple detection regions 50R. The multiple detection regions 50R are arranged along the first plane (the X-Y plane).

As shown in FIGS. 1 and 2, the detecting part 50 includes multiple detecting part electrodes 51 multiple detecting part interconnects 51L can be provided. Multiple detecting part interconnects 51L are electrically connected to respective of the multiple detecting part electrodes 51. One of the multiple detection regions 50R overlaps one of the multiple detecting part electrodes 51 in the first direction (the Z-axis direction). The portions that correspond to the multiple detecting part electrodes 51 are respectively used to form the multiple detection regions 50R. In the example, the detecting part 50 further includes a counter detecting part electrode 52. The organic photoelectric conversion layer 55 is between the counter detecting part electrode 52 and the multiple detecting part electrodes 51.

As shown in FIG. 2, the multiple detecting part electrodes 51 are arranged along the X-Y plane. Accordingly, the multiple detection regions 50R also are arranged along the X-Y plane. For example, the multiple detection regions 50R are arranged along the second direction (e.g., the X-axis direction) that is along the first plane (the X-Y plane), and are arranged along the third direction (e.g., the Y-axis direction) that is along the first plane and crosses the second direction.

For example, because the detecting part 50 includes the multiple detection regions 50R, the distribution (the distribution in the X-Y plane) of the intensity of the radiation 81 can be detected. The electrical signal 50s that is obtained from the detecting part 50 includes information relating to the intensity distribution of the radiation 81. In such a case, the first drive signal 71s that is supplied from the first drive circuit 71 to the first light-emitting part 10 includes information relating to the intensity distribution of the light emission of the first light-emitting part 10. A distribution of the light emission intensity that reflects the intensity distribution of the radiation 81 is obtained in the first light-emitting part 10 that is driven according to such a first drive signal 71s.

Thus, according to the embodiment, the first light emission intensity distribution in the first plane (the X-Y plane) of the multiple first light-emitting regions 10R corresponds to the distribution in the first plane of the intensity of the radiation 81 incident on the first layer 60. By such a configuration, the distribution of the intensity of the radiation 81 can be displayed for easier viewing with the naked eye. A radiation detector that is easier to use can be provided.

In one example, the multiple first light-emitting part electrodes 11 include a metal oxide. The metal oxide includes, for example, oxygen and at least one selected from the group consisting of In and Sn. Such a material has high transmittance for the radiation 81 (e.g., X-rays). By such a material, the reduction of the intensity of the radiation 81 can be suppressed, and the appropriate radiation 81 can be irradiated on the irradiated body 80.

As shown in FIGS. 1 and 2, the first light-emitting part 10 may include multiple first light-emitting part interconnects 11L. One of the multiple first light-emitting part interconnects 11L is electrically connected to one of the multiple first light-emitting part electrodes 11. For example, at least a portion of the multiple first light-emitting part interconnects 11L includes aluminum. Aluminum has high transmittance for the radiation 81 (e.g., X-rays). By such a material, the reduction of the intensity of the radiation 81 can be suppressed, and the appropriate radiation 81 can be irradiated on the irradiated body 80.

In one example as shown in FIG. 1, the size of one of the multiple detection regions 50R is less than the size of one of the multiple first light-emitting regions 10R. The noise is easily suppressed by such a configuration. The size of one of the multiple detection regions 50R is, for example, the length along the X-axis direction of the one of the multiple detection regions 50R. In such a case, the size of one of the multiple first light-emitting regions 10R is the length along the X-axis direction of the multiple first light-emitting regions 10R.

Figure 3:
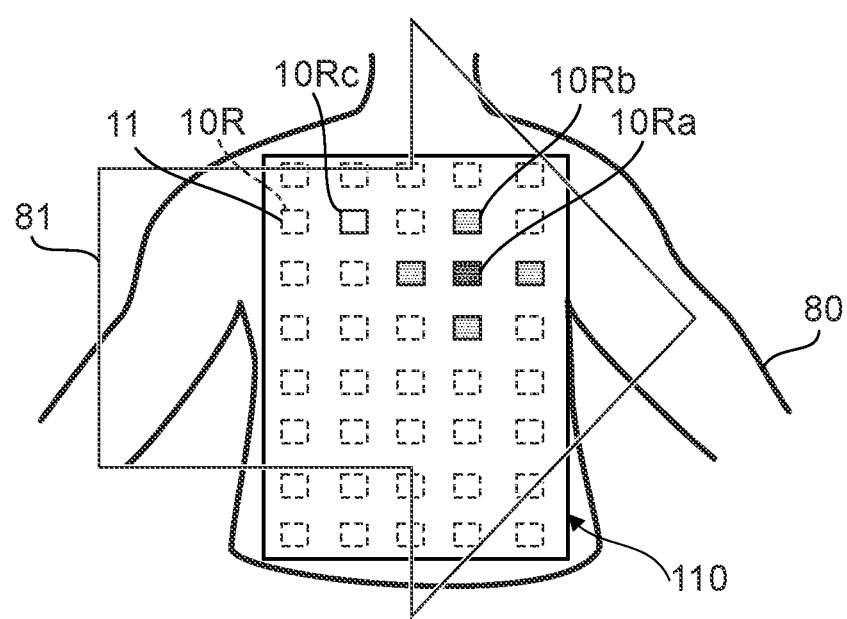
FIG. 3 is a schematic view illustrating the radiation detector according to the first embodiment.

FIG. 3 is a schematic view illustrating the radiation detector according to the first embodiment.

As shown in FIG. 3, the radiation 81 is irradiated on the irradiated body 80 (e.g., the human body) via the radiation detector 110. The light-emitting states of the multiple first light-emitting regions 10R included in the radiation detector 110 change according to the intensity of the radiation 81. For example, the multiple first light-emitting regions 10R include a region 10Ra, a region 10Rb, a region 10Rc, etc. The intensity of the radiation 81 in the region 10Ra is greater than the intensity of the radiation 81 in the region 10Rb. The intensity of the radiation 81 in the region 10Rb is between the intensities of the radiation 81 in the regions 10Ra and 10Rb. In such a case, for example, the light emission intensity in the region 10Ra is greater than the light emission intensity in the region 10Rc. The light emission intensity in the region 10Rb is between the light emission intensities in these regions. For example, due to the light emission intensity differences, the intensity of the radiation 81 can be more easily ascertained with the naked eye.

When the radiation 81 is irradiated on the irradiated body 80, the state (e.g., the intensity, etc.) of the light 10L from the first light-emitting part 10 may correspond to the cumulative value (the cumulative sum) of the intensity from the start of the irradiation to the end of the irradiation. According to the embodiment, the state (e.g., the intensity, etc.) of the light 10L may correspond to the intensity of the radiation 81 per unit time when irradiating.

According to the embodiment, a periodic light emission may be obtained. For example, the light emission is continuous in the regions in which the intensity of the radiation 81 is high. For example, the light emission is intermittent in the regions in which the intensity of the radiation 81 is low; and the pulse width, etc., may be different according to the intensity of the radiation.

According to the embodiment, the color of the light emission, etc., may be different according to the intensity of the radiation 81, etc.

Figure 4:
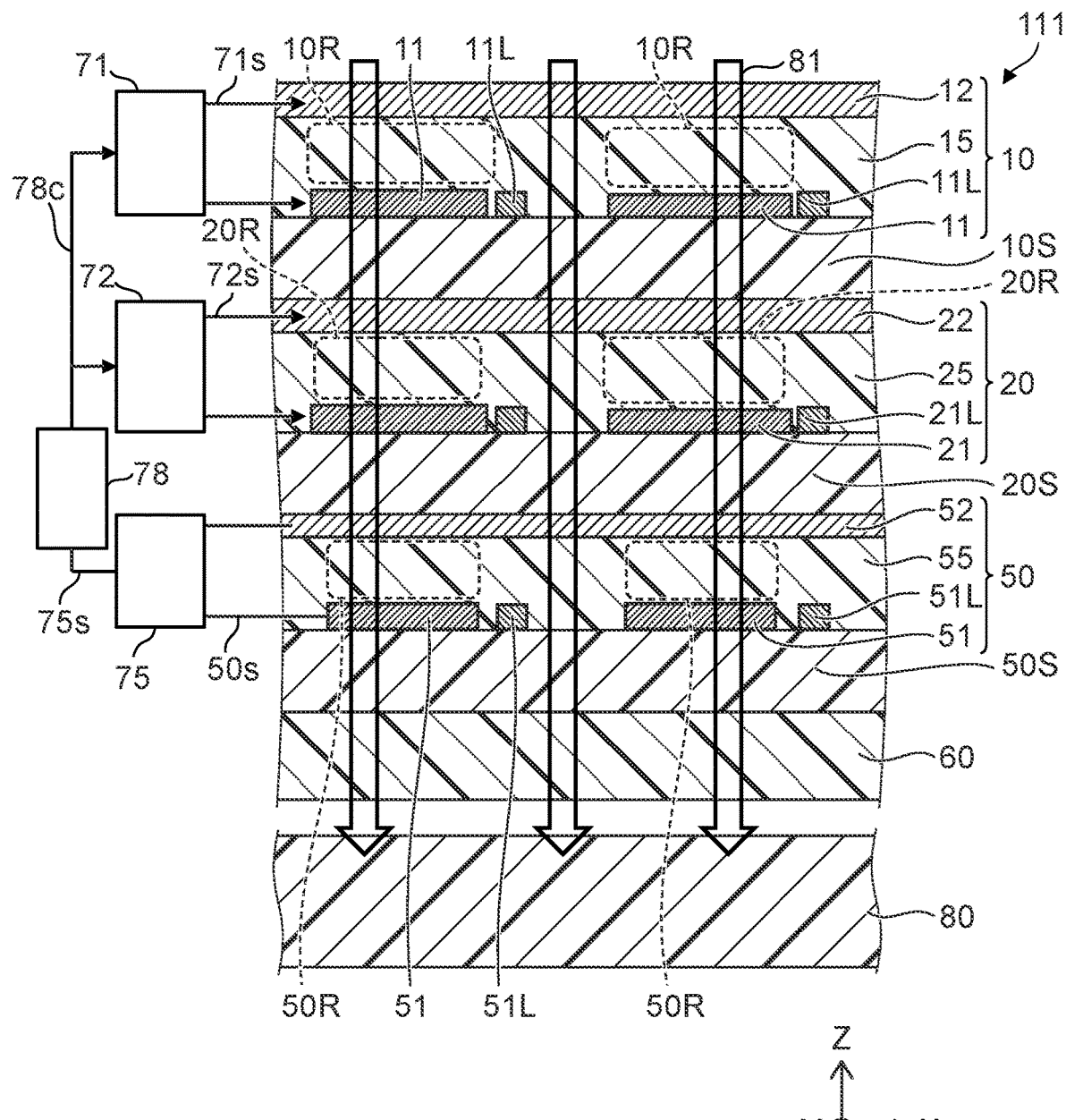
FIG. 4 is a schematic cross-sectional view illustrating a radiation detector according to the first embodiment.

FIG. 4 is a schematic cross-sectional view illustrating a radiation detector according to the first embodiment.

As shown in FIG. 4, the radiation detector 111 according to the embodiment includes a second light-emitting part 20 and a second drive circuit 72 in addition to the first layer 60, the first light-emitting part 10, the detecting part 50, the detection circuit 75, and the first drive circuit 71. The configurations of the first layer 60, the first light-emitting part 10, the detecting part 50, the detection circuit 75, and the first drive circuit 71 of the radiation detector 111 may be similar to those of the radiation detector 110. Interposing substrates 10S, 20S and 50S can be provided. Examples of the second light-emitting part 20 and the second drive circuit 72 will now be described.

As shown in FIG. 4, the second light-emitting part 20 includes a second organic light-emitting layer 25. The second light-emitting part 20 is located between the detecting part 50 and the first light-emitting part 10. The second drive circuit 72 is configured to supply a second drive signal 72s to the second light-emitting part 20 based on the detection signal 75s. Light emission that corresponds to the intensity of the radiation 81 detected by the detecting part 50 is obtained in the second light-emitting part 20.

For example, the color of the light emitted from the second light-emitting part 20 may be different from the color of the light emitted from the first light-emitting part 10. For example, by providing two light-emitting parts, the intensity of the radiation 81 can be displayed for easier understanding.

A control circuit 78 is provided in the example. The control circuit 78 is configured to control the first drive circuit 71 and the second drive circuit 72 based on the detection signal 75s. For example, a threshold may be determined for the detection intensity of the radiation 81. For example, when the detected intensity is less than the threshold, the first drive circuit 71 causes the first light-emitting part 10 to emit light; and the second drive circuit 72 does not cause the second light-emitting part 20 to emit light. For example, when the detected intensity is not less than the threshold, the first drive circuit 71 does not cause the first light-emitting part 10 to emit light; and the second drive circuit 72 causes the second light-emitting part 20 to emit light. For example, the peak wavelength of the light emitted from the second light-emitting part 20 is different from the peak wavelength of the light 10L emitted from the first light-emitting part 10. Yellow light is emitted from the first light-emitting part 10; and red light is emitted from the second light-emitting part 20. The intensity can be displayed for easier understanding by using colors to display the intensity of the radiation 81.

For example, the material of the second organic light-emitting layer 25 is different from the material of the first organic light-emitting layer 15. A color difference such as that described above is obtained thereby. Otherwise, the configuration of the second light-emitting part 20 may be similar to the configuration of the first light-emitting part 10.

For example, as shown in FIG. 4, the second light-emitting part 20 includes multiple second light-emitting part electrodes 21. One of multiple second light-emitting regions 20R overlaps one of the multiple second light-emitting part electrodes 21 in the first direction (the Z-axis direction). The portions that correspond to the multiple second light-emitting part electrodes 21 are respectively used to form the multiple second light-emitting regions 20R. In the example, the second light-emitting part 20 further includes a second counter light-emitting part electrode 22. The second organic light-emitting layer 25 is between the second counter light-emitting part electrode 22 and the multiple second light-emitting part electrodes 21.

For example, the multiple second light-emitting part electrodes 21 are arranged along the X-Y plane. Accordingly, the multiple second light-emitting regions 20R also are arranged along the X-Y plane. For example, the multiple second light-emitting regions 20R are arranged along the second direction (e.g., the X-axis direction) that is along the first plane (the X-Y plane), and are arranged along the third direction (e.g., the Y-axis direction) that is along the first plane and crosses the second direction.

As shown in FIG. 4, the second light-emitting part 20 may include multiple second light-emitting part interconnects 21L. One of the multiple second light-emitting part interconnects 21L is electrically connected to one of the multiple second light-emitting part electrodes 21. For example, at least a portion of the multiple second light-emitting part interconnects 21L includes aluminum.

Figure 5:
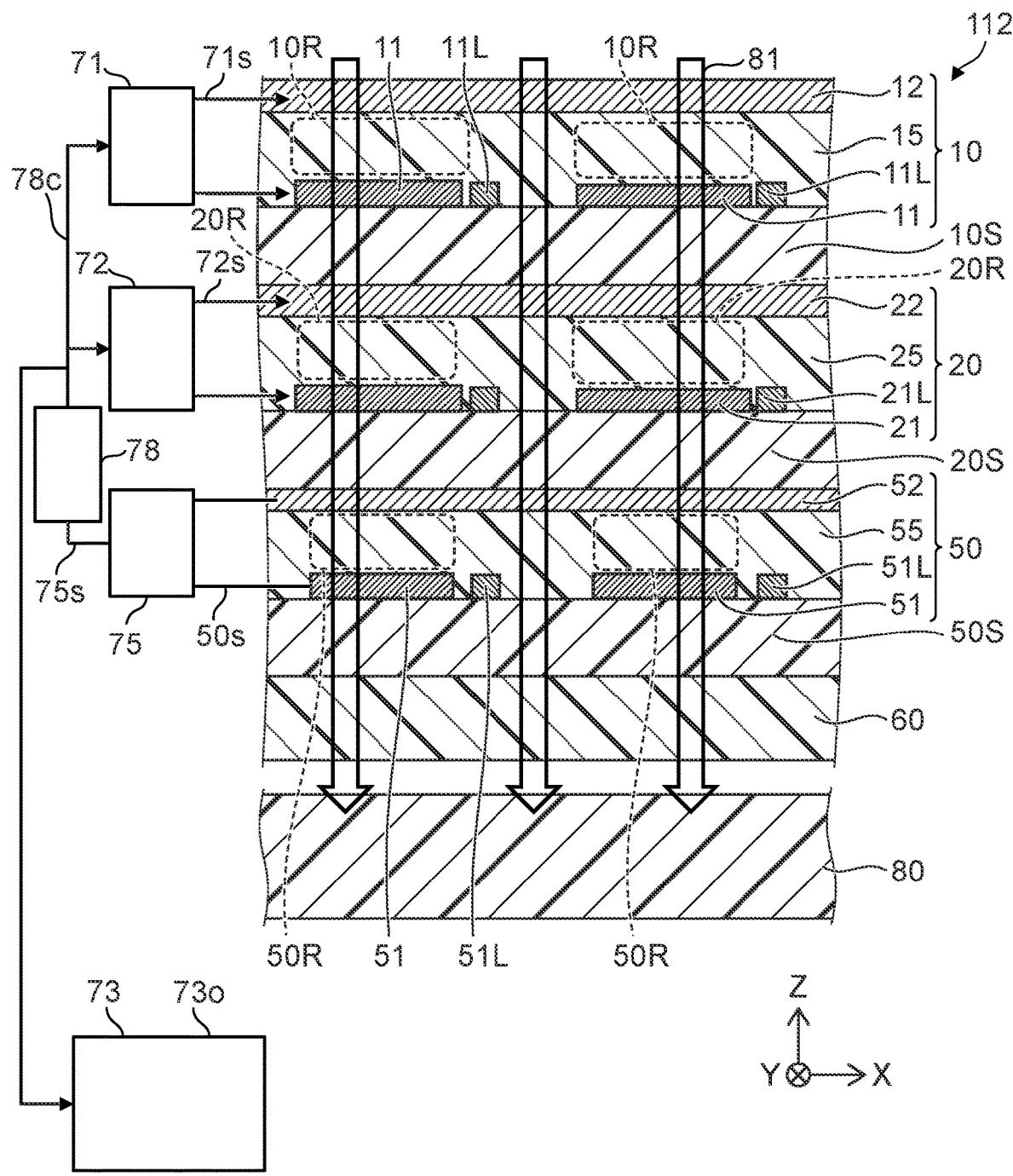
FIG. 5 is a schematic cross-sectional view illustrating a radiation detector according to the first embodiment.

FIG. 5 is a schematic cross-sectional view illustrating a radiation detector according to the first embodiment.

As shown in FIG. 5, the radiation detector 112 according to the embodiment includes a displayer 73 in addition to the first layer 60, the first light-emitting part 10, the detecting part 50, the detection circuit 75, the first drive circuit 71, the second light-emitting part 20, and the second drive circuit 72. The configurations of the first layer 60, the first light-emitting part 10, the detecting part 50, the detection circuit 75, the first drive circuit 71, the second light-emitting part 20, and the second drive circuit 72 of the radiation detector 112 may be similar to those of the radiation detector 111. An example of the displayer 73 will now be described.

The displayer 73 is configured to display according to the detection signal 75s. The displayer 73 may not overlap the first layer 60 in the first direction (the Z-axis direction). The radiation 81 may not be incident on the displayer 73. The displayer 73 may include any display device (e.g., an organic light-emitting display device, a liquid crystal display device, etc.). The displayer 73 is an example of an outputter 73o that is configured to output information (or a signal).

For example, the displayer 73 may display the intensity (and the distribution of the intensity) of the radiation 81 per unit time according to the detection result of the detecting part 50. For example, at least one of the first light-emitting part 10 or the second light-emitting part 20 may display the cumulative intensity (and the distribution of the intensity) of the radiation 81.

Figure 6:
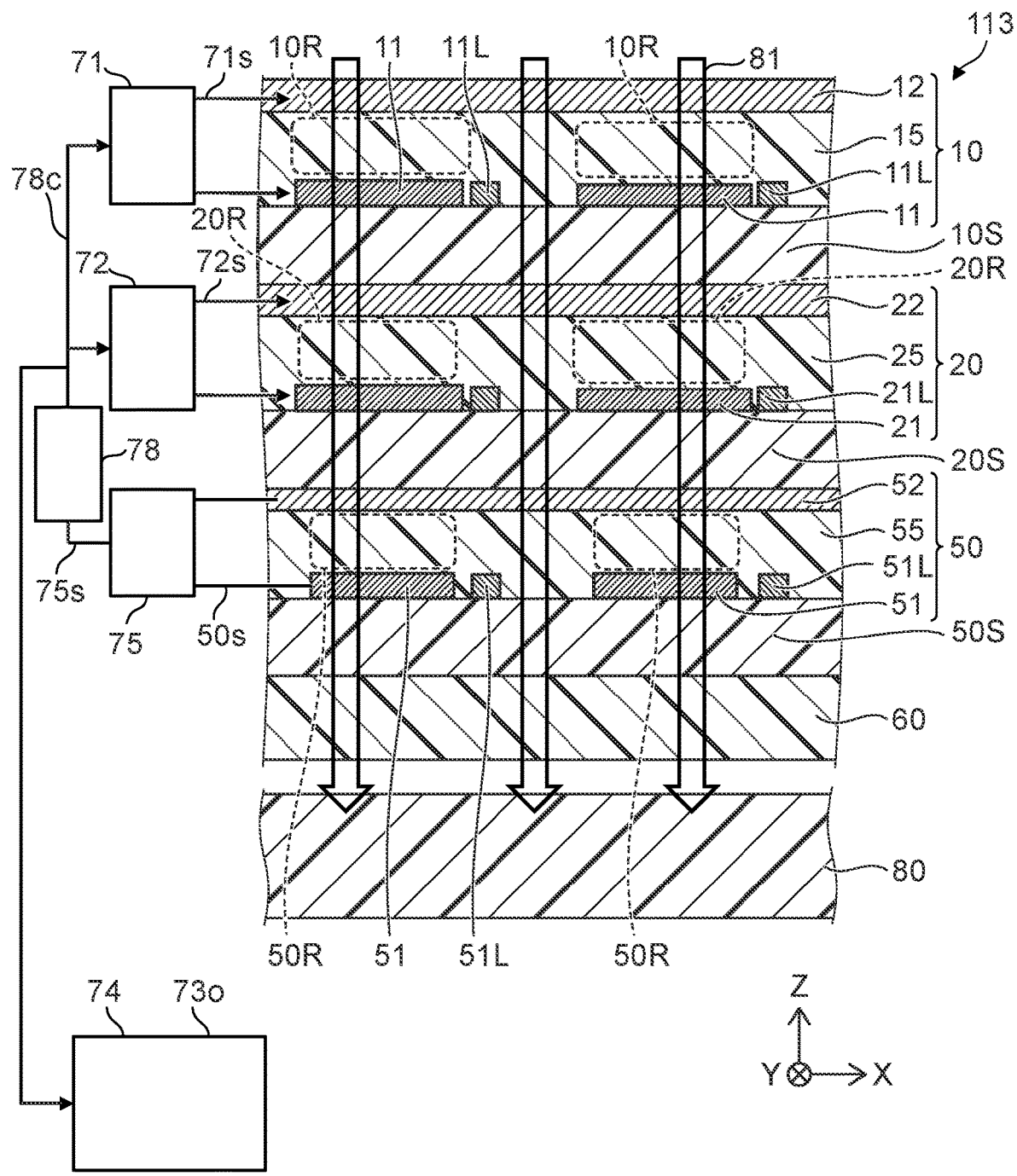
FIG. 6 is a schematic cross-sectional view illustrating a radiation detector according to the first embodiment.

FIG. 6 is a schematic cross-sectional view illustrating a radiation detector according to the first embodiment.

As shown in FIG. 6, the radiation detector 113 according to the embodiment includes a sound outputter 74 in addition to the first layer 60, the first light-emitting part 10, the detecting part 50, the detection circuit 75, the first drive circuit 71, the second light-emitting part 20, and the second drive circuit 72. The configurations of the first layer 60, the first light-emitting part 10, the detecting part 50, the detection circuit 75, the first drive circuit 71, the second light-emitting part 20, and the second drive circuit 72 of the radiation detector 113 may be similar to those of the radiation detector 111. An example of the sound outputter 74 will now be described.

The sound outputter 74 is configured to output a sound that corresponds to the detection signal 75s. The sound outputter 74 may not overlap the first layer 60 in the first direction (the Z-axis direction). The radiation 81 may not be incident on the sound outputter 74. The sound outputter 74 may include any sound output device (e.g., a speaker, etc.). The sound outputter 74 is an example of the outputter 73o that is configured to output information (or a signal).

For example, the sound outputter 74 may output a sound according to the detection result of the detecting part 50 when the detection intensity of the radiation 81 exceeds a threshold. For example, the sound outputter 74 may output a sound when the cumulative intensity of the radiation 81 exceeds a threshold. For example, the sound outputter 74 may output a sound when the radiation 81 is initially detected.

An example of the first layer 60 will now be described.

Figure 7:
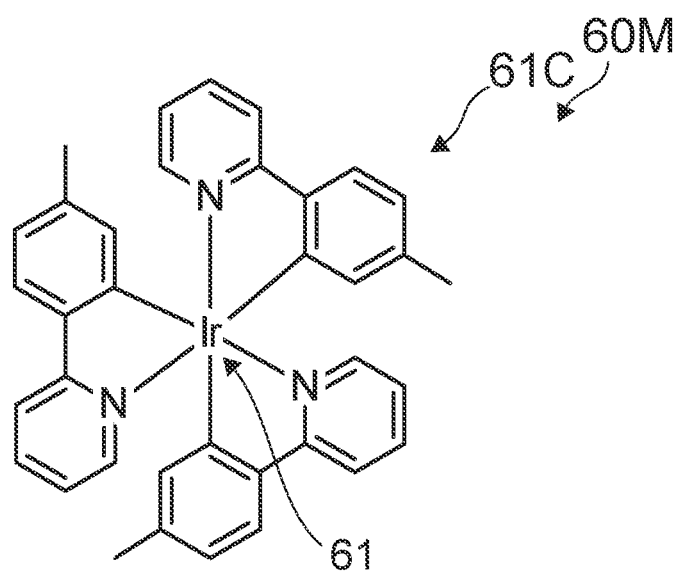
FIG. 7 is a schematic view illustrating a portion of the radiation detector according to the first embodiment.
Figure 8:
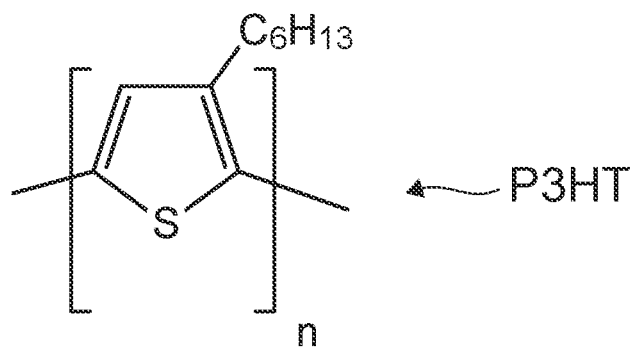
FIG. 8 is a schematic view illustrating a portion of the radiation detector according to the first embodiment.
Figure 9:
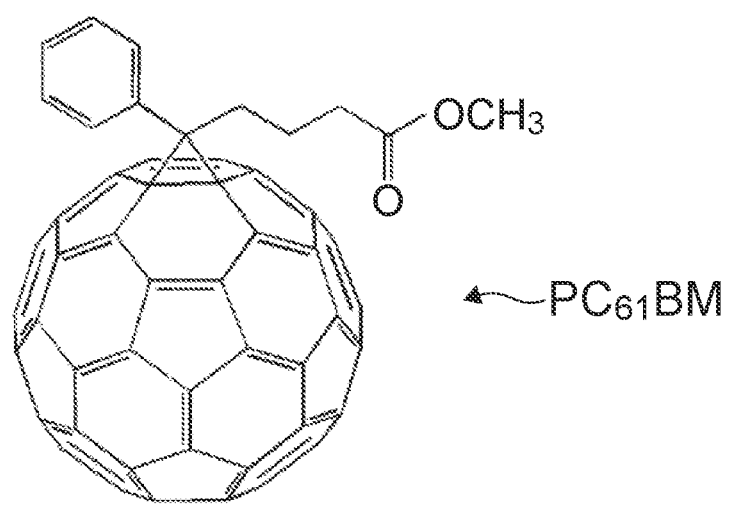
FIG. 9 is a schematic view illustrating a portion of the radiation detector according to the first embodiment.

FIGS. 7 to 9 are schematic views illustrating portions of the radiation detector according to the first embodiment.

The first organic material 60M that is included in the first layer 60 (referring to FIG. 1) includes a metal complex 61C (referring to FIG. 6). The metal complex 61C includes a first metallic element 61. The first metallic element 61 includes, for example, at least one selected from the group consisting of Ir, Pt, and Cu. In the example, the first metallic element 61 is Ir. In one example, the metal complex 61C is Ir(mppy)3 (Tris[2-(p-tolyl)pyridine]iridium (III)).

By including such a metal complex, the first organic material 60M can detect the radiation 81 with higher sensitivity.

Also, the first organic material 60M may include, for example, at least one selected from the group consisting of polyvinyl carbazole, polyvinyl toluene, polystyrene, and polymethyl methacrylate.

The thickness t60 of the first layer 60 (referring to FIG. 1) is not less than 500 μm and not more than 5000 μm. The radiation 81 can appropriately pass through the first layer 60 having such a thickness. Due to such a thickness, the light 60L can be appropriately generated by the radiation 81. For example, high sensitivity is obtained.

The first organic light-emitting layer 15 includes, for example, at least one selected from the group consisting of anthracene, a fluorescent material, an iridium complex, a copper complex, and a phosphorescent material. By including such a material in the first organic light-emitting layer 15, for example, yellow light is emitted from the first light-emitting part 10.

The second organic light-emitting layer 25 includes, for example, at least one selected from the group consisting of anthracene, a fluorescent material, an iridium complex, a copper complex, and a phosphorescent material. By including such a material in the second organic light-emitting layer 25, for example, red light is emitted from the second light-emitting part 20.

The first organic light-emitting layer 15 and the second organic light-emitting layer 25 may include a material other than the materials described above. For example, the material of the second organic light-emitting layer 25 may be different from the material of the first organic light-emitting layer 15. As a result, the peak wavelength of the light emitted from the second light-emitting part 20 is different from the peak wavelength of the light 10L emitted from the first light-emitting part 10.

The organic photoelectric conversion layer 55 includes, for example, P3HT (Poly(3-hexylthiophene)) (referring to FIG. 8), etc., as a p-type semiconductor material. The organic photoelectric conversion layer 55 includes, for example, fullerene as an n-type semiconductor material. The fullerene includes, for example, PC61BM ([6,6]-phenyl-$C_{61}$-butyric acid methyl ester) (referring to FIG. 9).

The first light-emitting part electrode 11 includes, for example, a metal oxide. The metal oxide includes, for example, oxygen and at least one selected from the group consisting of In and Sn.

The first counter light-emitting part electrode 12 includes, for example, a metal oxide. The metal oxide includes, for example, oxygen and at least one selected from the group consisting of In and Sn.

The second light-emitting part electrode 21 includes, for example, a metal oxide. The metal oxide includes, for example, oxygen and at least one selected from the group consisting of In and Sn.

The second counter light-emitting part electrode 22 includes, for example, a metal oxide. The metal oxide includes, for example, oxygen and at least one selected from the group consisting of In and Sn.

The detecting part electrode 51 includes, for example, a metal oxide. In one example, the metal oxide includes, for example, oxygen and at least one selected from the group consisting of In and Sn. In another example, the detecting part electrode 51 includes, for example, at least one selected from the group consisting of Al, Ag, and Ti.

The counter detecting part electrode 52 includes, for example, a metal oxide. The metal oxide includes, for example, oxygen and at least one selected from the group consisting of In and Sn.

Second Embodiment

A second embodiment relates to a radiation irradiation device.

Figure 10:
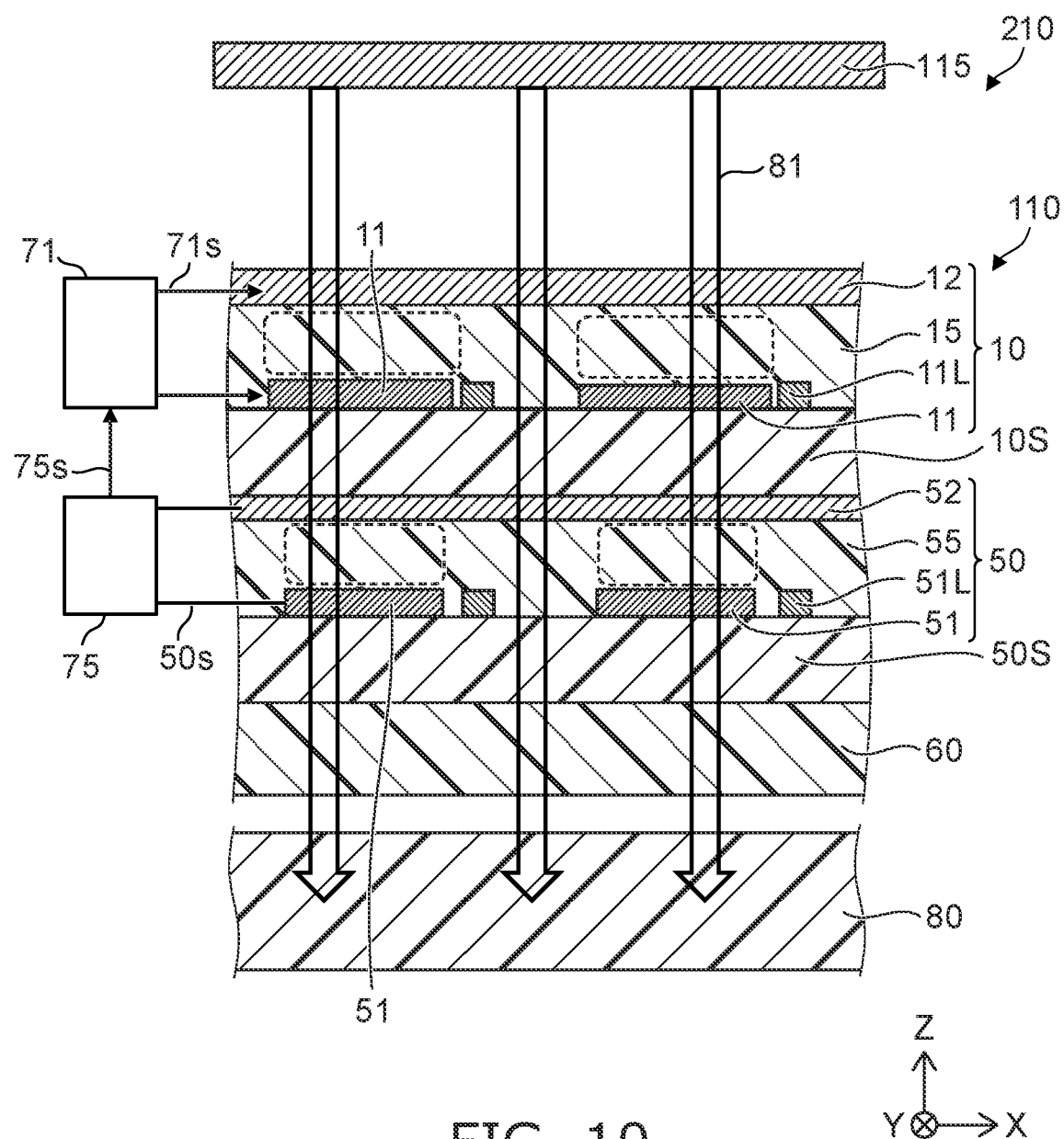
FIG. 10 is a schematic view illustrating a radiation irradiation device according to a second embodiment.

FIG. 10 is a schematic view illustrating a radiation irradiation device according to a second embodiment.

As shown in FIG. 10, the radiation irradiation device 210 according to the embodiment includes a radiation detector (in the example, the radiation detector 110) according to the first embodiment, and a radiation emitter 115 that causes the radiation 81 to be incident on the radiation detector (in the example, the radiation detector 110). A radiation irradiation device that is easier to use can be provided.

Third Embodiment

A third embodiment relates to a radiation detection method.

Figure 11:
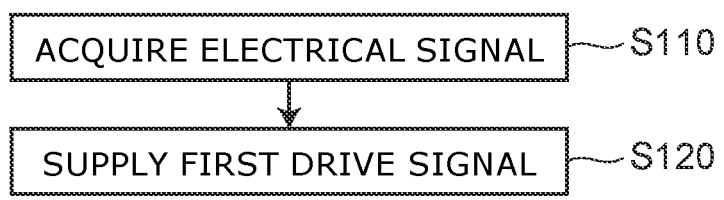
FIG. 11 is a flowchart illustrating a radiation detection method according to a third embodiment.

FIG. 11 is a flowchart illustrating the radiation detection method according to the third embodiment.

As shown in FIG. 11, the radiation detection method according to the embodiment includes acquiring the electrical signal 50s from the detecting part 50 (e.g., referring to FIG. 1) (step S110). As shown in FIG. 1, the detecting part 50 is located between the first layer 60 that includes the first organic material 60M and the first light-emitting part 10 that includes the first organic light-emitting layer 15. The detecting part 50 includes the organic photoelectric conversion layer 55. The electrical signal 50s corresponds to the radiation 81 incident on the first layer 60.

As shown in FIG. 11, the radiation detection method includes supplying the first drive signal 71s (referring to FIG. 1) to the first light-emitting part 10 based on a signal (e.g., the detection signal 75s) based on the electrical signal 50s (step S120). According to the embodiment, a radiation detection method that is easier to use can be provided.

Embodiments may include the following configurations (e.g., technological proposals).

Configuration 1

A radiation detector, comprising:
a first layer including a first organic material;
a first light-emitting part including a first organic light-emitting layer;
a detecting part provided between the first layer and the first light-emitting part, the detecting part including an organic photoelectric conversion layer and being configured to generate an electrical signal corresponding to radiation incident on the first layer;
a detection circuit configured to output a detection signal based on the electrical signal; and
a first drive circuit configured to supply a first drive signal to the first light-emitting part based on the detection signal.

Configuration 2

The radiation detector according to Configuration 1, wherein
the first layer is configured to emit light corresponding to an intensity of the radiation incident on the first layer.

Configuration 3

The radiation detector according to Configuration 1 or 2, wherein
the first light-emitting part includes a plurality of first light-emitting regions,
the plurality of first light-emitting regions is arranged along a first plane crossing a first direction,
the first direction is from the first layer toward the first light-emitting part, and
a first light emission intensity distribution in the first plane of the plurality of first light-emitting regions corresponds to a distribution in the first plane of an intensity of the radiation incident on the first layer.

Configuration 4

The radiation detector according to Configuration 3, wherein
the plurality of first light-emitting regions is arranged along a second direction and a third direction,
the second direction is along the first plane, and
the third direction is along the first plane and crosses the second direction.

Configuration 5

The radiation detector according to Configuration 4, wherein
the first light-emitting part includes a plurality of first light-emitting part electrodes, and
one of the plurality of first light-emitting regions overlaps one of the plurality of first light-emitting part electrodes in the first direction.

Configuration 6

The radiation detector according to Configuration 5, wherein
the plurality of first light-emitting part electrodes includes a metal oxide.

Configuration 7

The radiation detector according to Configuration 6, wherein
the first light-emitting part includes a plurality of first light-emitting part interconnects,
one of the plurality of first light-emitting part interconnects is electrically connected to one of the plurality of first light-emitting part electrodes, and
at least a portion of the plurality of first light-emitting part interconnects includes aluminum.

Configuration 8

The radiation detector according to any one of Configurations 3 to 7, wherein
the detecting part includes a plurality of detection regions, and
the plurality of detection regions is arranged along the first plane.

Configuration 9

The radiation detector according to Configuration 8, wherein
the detecting part includes a plurality of detection part electrodes, and
one of the plurality of detection regions overlaps one of the plurality of detecting part electrodes in the first direction.

Configuration 10

The radiation detector according to Configuration 8 or 9, wherein a size of one of the plurality of detection regions is less than a size of one of the plurality of first light-emitting regions.

Configuration 11

The radiation detector according to any one of Configurations 1 to 10, wherein the first organic material includes a metal complex including a first metallic element.

Configuration 12

The radiation detector according to Configuration 11, wherein the first metallic element includes at least one selected from the group consisting of Ir, Pt, and Cu.

Configuration 13

The radiation detector according to any one of Configurations 1 to 12, wherein a thickness of the first layer is not less than 500 μm and not more than 5000 μm.

Configuration 14

The radiation detector according to any one of Configurations 1 to 13, further comprising:

a second light-emitting part including a second organic light-emitting layer; and a second drive circuit, the second light-emitting part being between the detecting part and the first light-emitting part, the second drive circuit being configured to supply a second drive signal to the second light-emitting part based on the detection signal.

Configuration 15

The radiation detector according to Configuration 14, further comprising:

a control circuit, the control circuit being configured to control the first and second drive circuits based on the detection signal, a peak wavelength of light emitted from the second light-emitting part being different from a peak wavelength of light emitted from the first light-emitting part.

Configuration 16

The radiation detector according to any one of Configurations 1 to 15, further comprising:

an outputter, the outputter being configured to output information corresponding to the detection signal.

Configuration 17

The radiation detector according to any one of Configurations 1 to 16, wherein the first layer transmits the radiation that passes through the first light-emitting part and is incident on the first layer.

Configuration 18

The radiation detector according to any one of Configurations 1 to 17, wherein the radiation includes X-rays.

Configuration 19

A radiation irradiation device, comprising:

the radiation detector according to any one of Configurations 1 to 18; and a radiation emitter causing the radiation to be incident on the detector.

Configuration 20

A radiation detection method, comprising:

acquiring an electrical signal from a detecting part provided between a first layer and a first light-emitting part, the first layer including a first organic material, the first light-emitting part including a first organic light-emitting layer, the detecting part including an organic photoelectric conversion layer, the electrical signal corresponding to radiation incident on the first layer; and supplying a first drive signal to the first light-emitting part based on a signal based on the electrical signal.

According to embodiments, a radiation detector, a radiation irradiation device, and a radiation detection method that are easier to use can be provided.

In the specification, "a state of being electrically connected" includes a state in which multiple conductors physically contacts and a current flows between the multiple conductors. "The state of being electrically connected" includes a state in which another conductor is inserted between the multiple conductors and a current flows between the multiple conductors.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as conductive layers, first layers, organic semiconductor materials, metal complexes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors practicable by an appropriate design modification by one skilled in the art based on the radiation detectors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:

a first layer including a first organic material;

a first light-emitting part including a first organic light-emitting layer;

a detecting part provided between the first layer and the first light-emitting part, the detecting part including an organic photoelectric conversion layer and being configured to generate an electrical signal corresponding to radiation incident on the first layer;

a detection circuit configured to output a detection signal based on the electrical signal; and a first drive circuit configured to supply a first drive signal to the first light-emitting part based on the detection signal, wherein
the first light-emitting part includes a plurality of first light-emitting regions,
the plurality of first light-emitting regions is arranged along a first plane crossing a first direction,
the first direction is from the first layer toward the first light-emitting part,
a first light emission intensity distribution in the first plane of the plurality of first light-emitting regions corresponds to a distribution in the first plane of an intensity of the radiation incident on the first layer,
the plurality of first light-emitting regions is arranged along a second direction and a third direction,
the second direction is along the first plane,
the third direction is along the first plane and crosses the second direction,
the first light-emitting part includes a plurality of first light-emitting part electrodes,
one of the plurality of first light-emitting regions overlaps one of the plurality of first light-emitting part electrodes in the first direction,
the first light-emitting part includes a plurality of first light-emitting part interconnects,
one of the plurality of first light-emitting part interconnects is electrically connected to one of the plurality of first light-emitting part electrodes,
the detecting part includes a plurality of detection regions,
the plurality of detection regions is arranged along the first plane,
the detecting part includes a plurality of detecting part electrodes,
one of the plurality of detection regions overlaps one of the plurality of detecting part electrodes in the first direction,
the detecting part includes a plurality of detecting part interconnects,
one of the plurality of detecting part interconnects is electrically connected to one of the plurality of detecting part electrodes, and
at least a part of the one of the plurality of first light-emitting part interconnects overlaps at least a part of the one of the plurality of detecting part interconnects in the first direction.

2. The radiation detector according to claim 1, wherein the first layer is configured to emit light corresponding to an intensity of the radiation incident on the first layer.

3. The radiation detector according to claim 1, wherein the plurality of first light-emitting part electrodes includes a metal oxide.

4. The radiation detector according to claim 3, wherein at least a portion of the plurality of first light-emitting part interconnects includes aluminum.

5. The radiation detector according to claim 1, wherein a size of one of the plurality of detection regions is less than a size of one of the plurality of first light-emitting regions.

6. The radiation detector according to claim 1, wherein the first organic material includes a metal complex including a first metallic element.

7. The radiation detector according to claim 6, wherein the first metallic element includes at least one selected from the group consisting of Ir, Pt, and Cu.

8. The radiation detector according to claim 1, wherein a thickness of the first layer is not less than 500 μm and not more than 5000 μm.

9. The radiation detector according to claim 1, further comprising:
a second light-emitting part including a second organic light-emitting layer; and
a second drive circuit,
the second light-emitting part being between the detecting part and the first light-emitting part,
the second drive circuit being configured to supply a second drive signal to the second light-emitting part based on the detection signal.

10. The radiation detector according to claim 9, further comprising:
a control circuit,
the control circuit being configured to control the first and second drive circuits based on the detection signal,
a peak wavelength of light emitted from the second light-emitting part being different from a peak wavelength of light emitted from the first light-emitting part.

11. The radiation detector according to claim 1, further comprising:
an outputter,
the outputter being configured to output information corresponding to the detection signal.

12. The radiation detector according to claim 1, wherein the first layer transmits the radiation that passes through the first light-emitting part.

13. The radiation detector according to claim 1, wherein the radiation includes X-rays.

14. A radiation irradiation device, comprising:
the radiation detector according to claim 1; and
a radiation emitter causing the radiation to be incident on the detector.

* * * * *